United States Patent
Li

(10) Patent No.: US 8,143,510 B2
(45) Date of Patent: Mar. 27, 2012

(54) THERMOELECTRIC COMPOSITE SEMICONDUCTOR

(76) Inventor: John H. Li, Pittsburgh, PA (US)

(*) Notice: Subject to any disclaimer, the term of this patent is extended or adjusted under 35 U.S.C. 154(b) by 0 days.

(21) Appl. No.: 13/136,057

(22) Filed: Jul. 21, 2011

(65) Prior Publication Data
US 2011/0277802 A1   Nov. 17, 2011

Related U.S. Application Data

(62) Division of application No. 12/930,464, filed on Jan. 7, 2011, now Pat. No. 8,008,571, which is a division of application No. 11/731,836, filed on Apr. 2, 2007, now abandoned.

(51) Int. Cl.
*H01L 35/04* (2006.01)
(52) U.S. Cl. .................. 136/224; 136/205
(58) Field of Classification Search ........... 136/200–242
See application file for complete search history.

(56) References Cited

U.S. PATENT DOCUMENTS

| | | | | |
|---|---|---|---|---|
| 5,006,178 A | * | 4/1991 | Bijvoets | 136/211 |
| 5,156,004 A | * | 10/1992 | Wu et al. | 62/3.1 |
| 8,008,571 B2 | * | 8/2011 | Li | 136/205 |

* cited by examiner

*Primary Examiner* — Jessica L Ward
*Assistant Examiner* — Kevin E Yoon
(74) *Attorney, Agent, or Firm* — Clifford A. Poff; Suzanne Kikel

(57) ABSTRACT

Heat transfer to refrigerate or heat uses a thermoelectric semiconductor structure including a P-type composite of dices of semiconductor material alloyed with P-type material forming spaced collector regions at junctions with a P-type conductive material for flux of electrical current and a N-type composite of dices of semiconductor material alloyed with N-type material forming spaced collector regions at junctions with a N-type conductive material for flux of electrical current. The thickness of each the dices is sufficient to form a PN junction. Electrically conductive buss bars form an electrical circuit between the dices of N-type conductivity and the dices of P-type conductivity. An electrically conductive buss bar forms an electrical circuit connection between the dices of N-type conductivity and the dices of P-type conductivity. An electrical potential is applied by terminals between the P-type composite and the N-type composite to induce a flux of heat concurrent with the flux of electrical current.

6 Claims, 6 Drawing Sheets

THERMOELECTRIC COMPOSITE SEMICONDUCTOR

CROSS-REFERENCE TO RELATED APPLICATIONS

This application is a divisional application of U.S. Ser. No. 12/930,464 filed Jan. 7, 2011 now U.S. Pat. No. 8,008,571, now allowed, which is a divisional application of U.S. Ser. No. 11/731,836 filed Apr. 2, 2007, now abandoned, which are incorporated herein by reference in their entirety.

BACKGROUND OF THE INVENTION

Field of the Invention

The present invention relates to a thermoelectric semiconductor structure comprised of one or both of a P-type composite and an N-type composite concurrently conductive of heat flux and electric flux with low electric flux losses for versatile and high efficiency thermoelectric operations.

Both N-type and P-type thermoelectric semiconductor materials are typical used in a thermoelectric cooler module as schematically illustrated in FIG. 1 according to the prior Art. Heat is caused to move through the thermoelectric cooler module in one direction as identified by Arrows A while electrical current i passes between the cold junction electrode C and hot junction electrode H through each of the thermoelectric N-type semiconductor material and the thermoelectric P-type semiconductor material. The N-type semiconductor material is doped to have an excess of electrons, i.e. more electrons than needed to complete a perfect molecular lattice structure, and P-type semiconductor material is doped so that it will have a deficiency of electrons, i.e. fewer electrons than are necessary to complete a perfect lattice structure. The extra electrons in the N-type semiconductor material and the holes resulting from the deficiency of electrons in the P-type semiconductor material are the carriers which move the heat energy through the thermoelectric semiconductor materials. Most thermoelectric cooling modules are fabricated with an equal number of N-type and P-type semiconductors where a pair of N-type and P-type elements come together to form a thermoelectric couple. The present invention is founded on the realization that the thermoelectric phenomenon occurring when using semiconductor materials of both N-type and P-type cause unfavorable operating performance because the heat conduction and electrical flow properties are different in each of the N-type and P-type semiconductor materials.

Both Peltier effect and Joule heating effect play very important roles in thermoelectric phenomenon. The Peltier effect takes place at a PN junction only but the Joule heating affect is distributed along entire length of the elements. The rate at which heat is generated by Joule's effect is directly proportional to the square of the electric current whereas the rate at which heat is generated by the Peltier effect is directly proportional to the current. Heat is always generated in Joule heating effect, whereas in the Peltier effect heat is evolved at one junction and absorbed at the other. It is for these underlying principals that the Composite Semi-conductive Thermoelectric Refrigerating illustrated and described in U.S. Pat. No. 5,156,004 suffers from the unfavorable operation performance.

The P-type and N-type semiconductor elements or dices act as the electric lane to conduct heat from the cold junction to the hot junction by an electric current. The P-type and N-type semiconductor elements also serve to separate the cold junction and the hot junction to avoid heat transfer from dices from the hot junction to the cold junction. To significantly enhance the cooling effect, it is necessary to find a material or structure to make both dices have a maximum heat delivering capability and a feature to prevent or at least minimize a return flow of heat. There are no known semiconductor materials with the high Seeback coefficients to maximize the structure used for the heat delivering capability and, at the same time, the P-type and N-type semiconductor elements must function to minimize the heat flowing back either by decreasing heat generation i.e., lowering the electric resistance or by increasing thermal insulation.

The present invention seeks to provide a semiconductor structure for electronically combining thermoelectric and convective heat transfer methods to build a high heat flux exchanger for heat transfer in a semiconductor package in the field of thermal cooling. The semiconductor package utilize the Peltier effect and have the advantages of no moving parts, a lightweight construction, maintenance-free and quiet operation, and an environmentally friendly construction. The Peltier effect is the transport of heat by an electric current but the flow of heat changes abruptly at a PN junction between the two dissimilar materials by either liberating or absorbing heat. Within each branch of the junction the current conducts heat, rather than generating heat. The efficiency of refrigeration is much lower than Carnot refrigeration efficiency. Due to low efficiency between electric power and thermal energy, this method has been usually viewed as a viable technology only for use in low capacity cooling applications.

Accordingly, it is an object of the present invention to provide a composite P element and a composite N element instead of pure semiconductor elements, the composite P element is doped with P-type material and the composite N element is doped with N-type material and the composite elements are arranged to form a structure for thermoelectric cooling.

Another object of the present invention is to increase the efficiency of a thermoelectric semiconductor package for viable usages such as in commercial and residential refrigerators using semiconductor material at less expense than other thermoelectric technology and eliminate environmentally threatening use of refrigerants.

It is a further object of the present invention to provide a thermoelectric semiconductor package particularly useful for refrigerators and air conditioners as well as cooling operation of medical instruments, computers, infrared optical equipment and intermittent temperature control such as vending machines.

It is another object of the present invention to provide a thermoelectric semiconductor embodied as a composite P-type element and a composite N-type element to reduce heat generation by the semi-conductor and increase heat flux from the hot source to the cold source or from the cold source to the hot source as determined by the polarity of the applied electric current.

It is another object of the present invention to provide multistage composite thermoelectric module to not only increase the temperature differential between the refrigeration temperature and heat sink temperature but also increase the thermal capacity for removing heat from the refrigeration area.

BRIEF SUMMARY OF THE INVENTION

More particularly, the present invention provides a thermoelectric semiconductor structure including the combination of a P-type composite comprised of a plurality of dices of semiconductor material alloyed with P-type material forming spaced collector regions at junctions with a P-type conductive material for flux of electrical current, and a N-type composite comprised of a plurality of dices of semiconductor material alloyed with N-type material forming spaced collector regions at junctions with a N-type conductive material for flux of electrical current, the thickness of each the dices being sufficient to form a PN junction thereof, and an electrically conductive buss bar forming an electrical circuit connection between the dices of N-type conductivity and the dices of P-type conductivity; and terminals for applying an electrical potential between the P-type composite and the N-type composite to induce a flux of heat concurrent with the flux of electrical current.

The present invention also provides a thermoelectric semiconductor structure including the combination of a composite comprised of a plurality of dices of semiconductor material alloyed with P-type material or N-type material forming spaced collector regions at junctions with a conductor of the same type conductive material for flux of electrical current, a plurality of dices of semiconductor material alloyed with P-type or N-type material forming PN junctions with the composite conductor for flux of electrical current, the thickness of each the dices being sufficient to form a PN junction thereof, and plurality of thermal electric junctions connected in series by electrically conductive busses, and terminals to apply an electrically current across the PN junctions to induce a flux of heat concurrent with the flux of electrical current.

The present invention also provides a thermal electric structure including a plurality of thermal electric junctions connected in series by electrically conductive busses, and terminals to apply an electrically current across the serially connected thermal electric junctions, each of the thermal electric junctions comprising an elongated semiconductor of either N-type or P-type conductivity joined in an end-to-end relation between an elongated electrical conductor and one of the electrically conductive busses, a first semiconductor dice of a conductivity type different from conductivity type of the elongated semiconductor joined with the elongated electrical conductor opposite the elongated semiconductor for establishing a composite P-N junction for both high thermal flux and high electrical flux; and an elongated conduit of the same conductivity type as the first semiconductor dice connected for a high electrical flux return path and a low heat flux return path from the first semiconductor dice to a second semiconductor dice, the second semiconductor dice joined to another of the electrically conductive busses.

BRIEF DESCRIPTION OF THE SEVERAL VIEWS OF THE DRAWINGS

The present invention will be more fully understood when the following description is read in light of the accompany drawings of which.

DETAILED DESCRIPTION OF THE INVENTION

Figure 1:
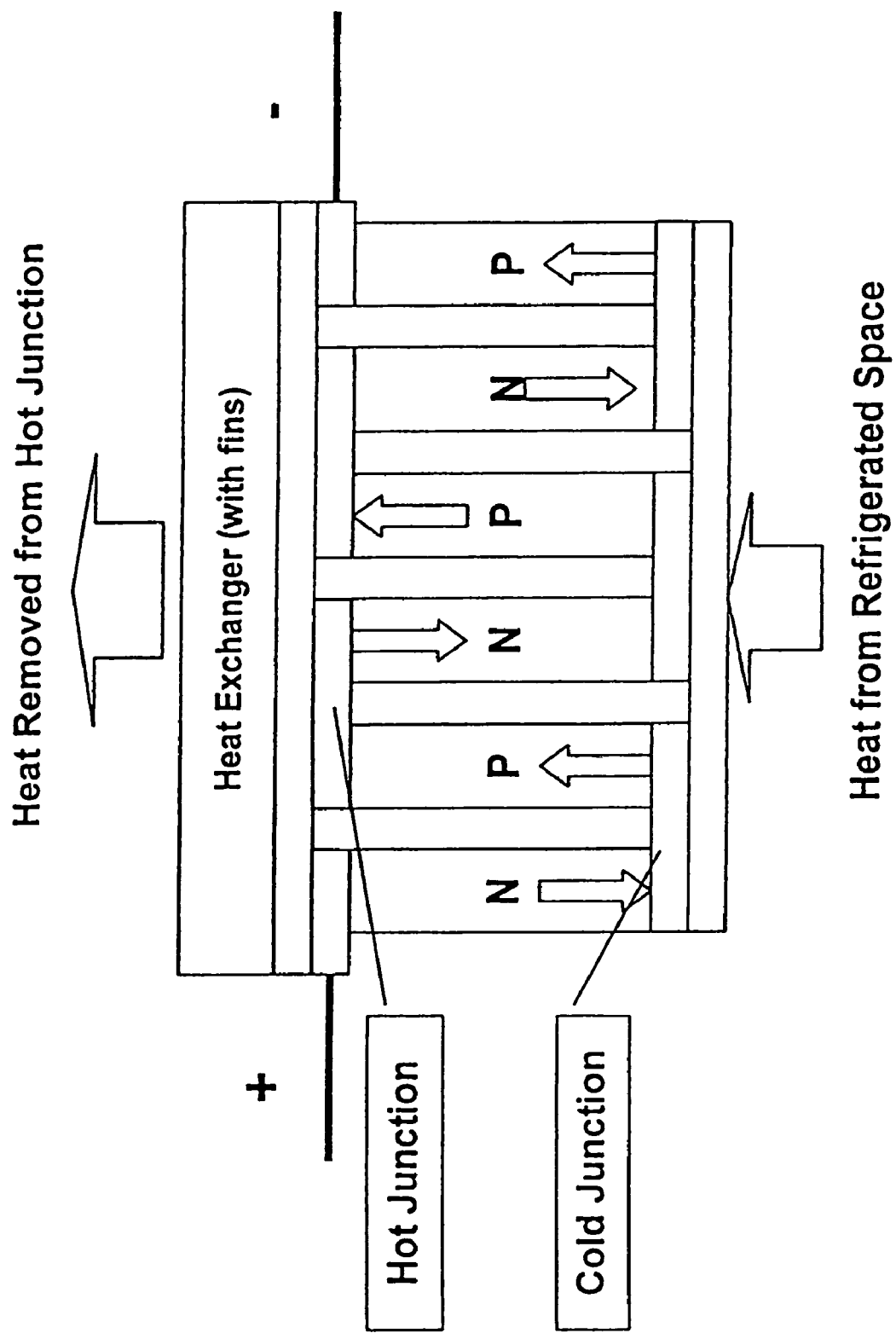
FIG. 1 is an illustration of a conventional, well known in the art, thermoelectric semiconductor module.
Figure 2:
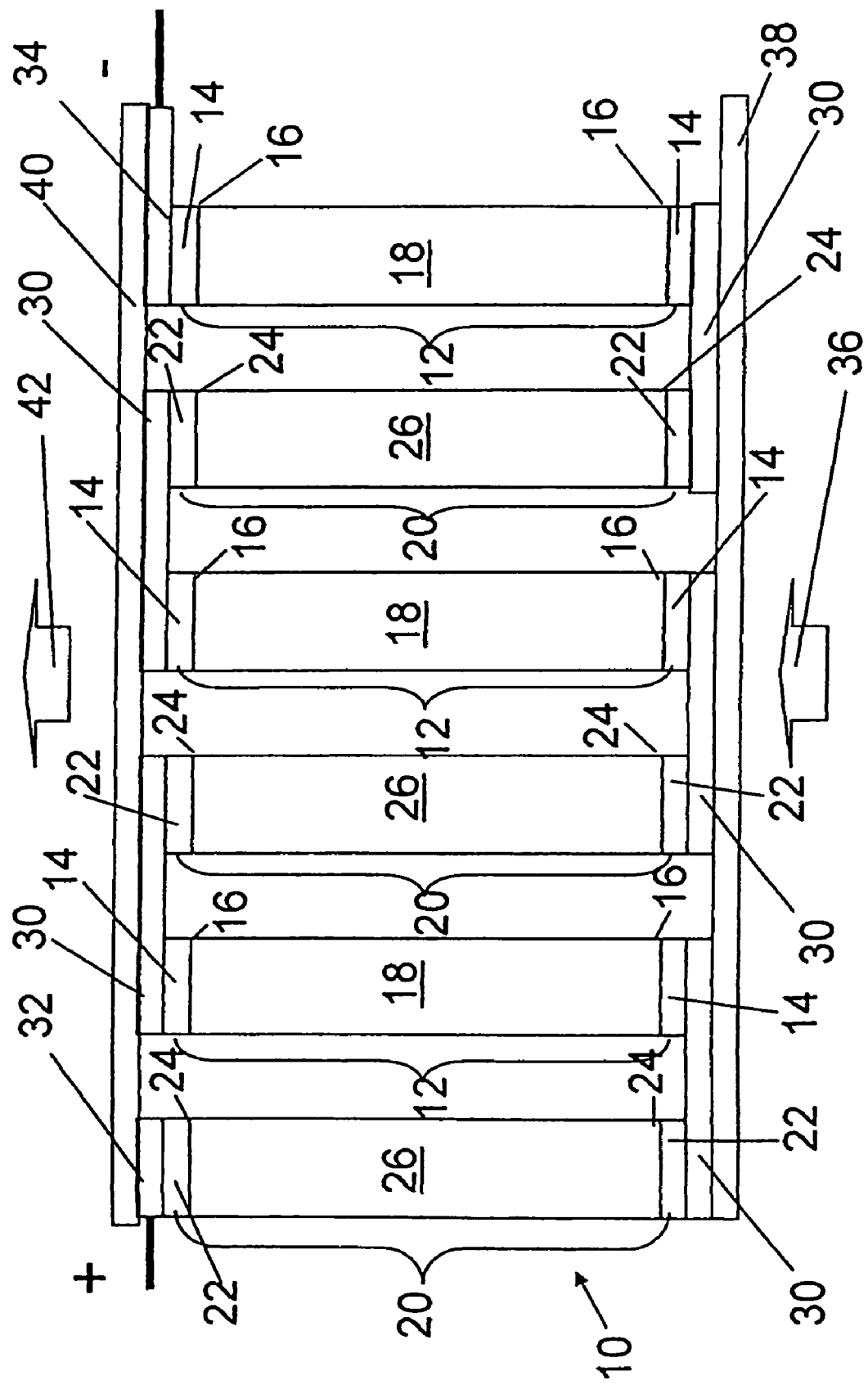
FIG. 2 is an illustration of a composite thermoelectric semiconductor module embodying the features of the present invention.

A first embodiment of a thermoelectric semiconductor structure 10 according to the present invention is illustrated in FIG. 2 and includes at least one P-type composite 12 but usually a plurality of which three P-type composites 12 are shown. Each P-type composite 12 is comprised of two dices 14 of semiconductor material alloyed with P-type material forming spaced collector regions at junctions 16 with a P-type conductive material 18 for flux of electrical current. The P-type conductive material 18 is hole-type material, for example, graphite. The semiconductor structure 10 further includes at least one N-type composite 20 but usually a plurality of composites of which three N-type composites 20 are shown. Each N-type composite is comprised of two of dices 22 of semiconductor material alloyed with N-type material forming spaced collector regions at junctions 24 with an N-type conductive material 26 for flux of electrical current. The N-type conductive material 26 is electron carrier type material, for example, copper. The number of P-type composites 12 are preferably equal to the number of N-type composites 20 and arranged as an alternating occurrence in a series electrical circuit formed by buss bars 30 comprised of copper or other suitable electrically conductive material. Electrically conductive terminal bars 32 and 34 form electrical circuit connections between the dices 22 of N-type conductivity and the dices 14 of P-type conductivity to induce a flux of heat concurrent with the flux of electrical current. The use of buss bars to form the series electrical circuit increases to electrical resistance of the electrical circuit so that the circuit operates at a higher voltage and provides the desired feature according to the present invention of a faster cooling rate by the use of electric current in a range up to, for example, 20 ampere and greater. The flux of heat is in the direction of the arrow 36 located in a refrigeration site, for example, through a high thermal conductivity ceramic plate 38 and then as a heat flux through the P-type and N-type composites 12 and 20 including the PN junctions thereof to heat sink formed by a high thermal conductivity ceramic plate 40 where the heat is released in the cooling channel in the direction indicated by arrows 42. However, it is sufficient according to the present invention that since the buss bars 30 are part of the flux path of heat that the buss bars act alone to release heat to the cooling channel, therefore the ceramic plate 40 can be eliminated if desired. The ceramic plates 38 and 40 are, for example, comprised of aluminum oxide, i.e. $Al_2O_3$ serve the important functions of providing enhanced thermal conduction and also to electrically insulate the thermal electric module from the surrounding environment. The provision of the P-type composites and N-type composites allow the thickness of P and N dices to be very thin and thereby reduce the total heat generation by the flux of electrical current in the dices to increase the thermoelectric efficiency. Preferably, the thickness of the dices 14 and 22 are as thin as possible, typically for example 1 mm or less. The critical thickness of each dices is a thickness larger than the thickness, and therefore sufficient, to form a P-N junction. The thickness the dices must be sufficient to operated in the composites consisting of two dices of N-type conductivity joined by N-type conductor and two dices of P-type conductivity connected joined by a P-type conductor. The construction thermoelectric semiconductor structure 10 using P-type and N-type composites allows the choice of conductive material 18 and 26 from a variety different materials having a very low electric resistance and with physical configurations to allow a selection of the location for a cooling zone and a heat sink. The conductive material 18 and 26 can take the form of shaped structures, for example, a heavy duty cable comprised of a solid mass or wire like strands, filaments or the like. Preferably one or both of conductors of N-type conductivity and P-type conductivity are mechanically sufficiently flexible for selectively establishing a desired heat discharge site for flux of heat as indicated by arrow 42. The mechanical flexible feature of the present invention allows that the orientation of the heat discharge site to be remotely spaced and when desired angularly orientated as desired in relation to the heat source.

Figure 3:
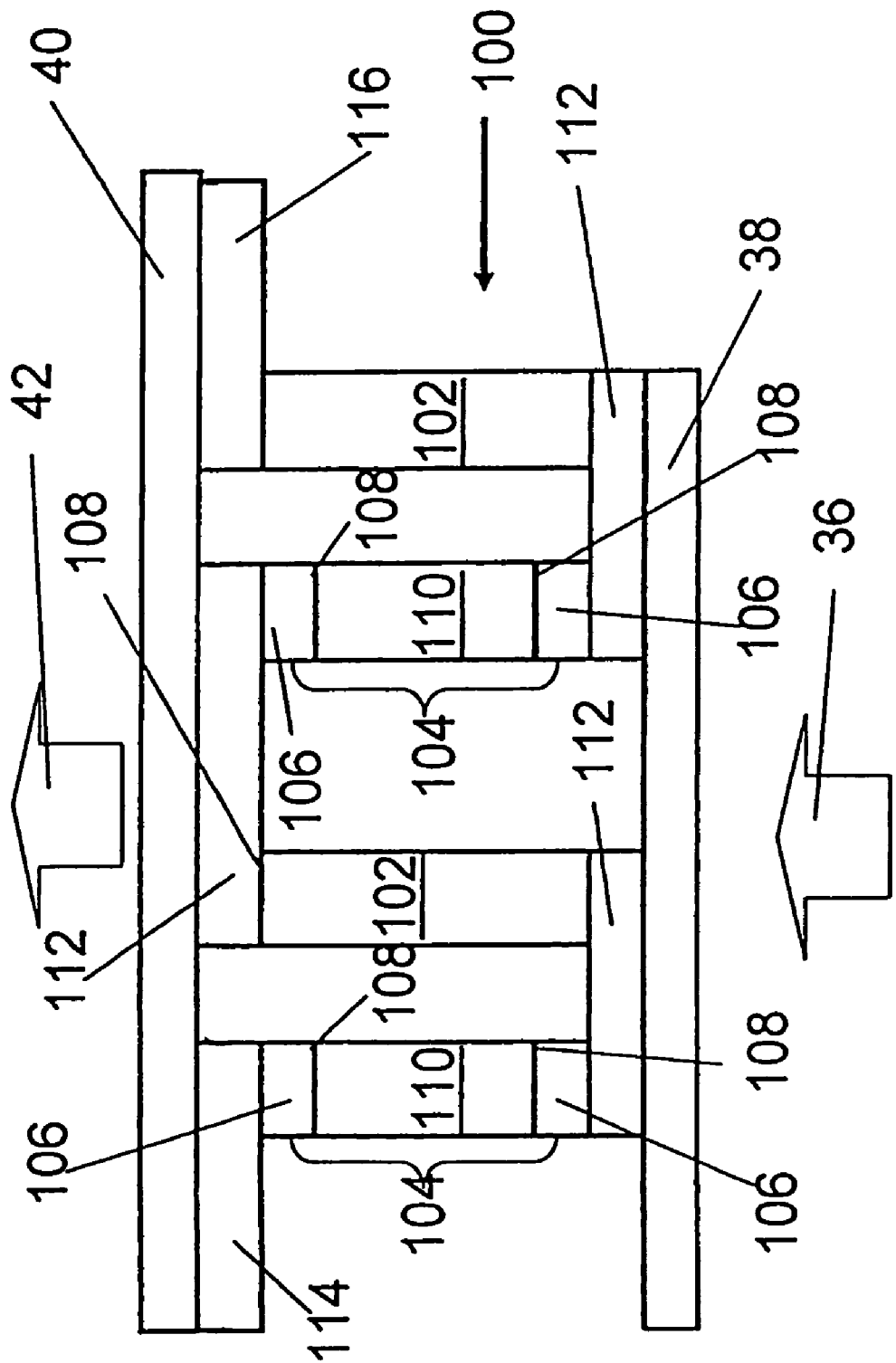
FIG. 3 illustrates a hybrid composite thermoelectric semiconductor embodying the features of the present invention.

FIG. 3 illustrates a hybrid composite thermoelectric semiconductor structure 100 comprised of semiconductor members 102 of one of P-type or N-type semiconductor material and composites 104 of the other of P-type or N-type semiconductor material. Each of the composite 104 is comprised of two dices 106 of semiconductor material alloyed with the selected one of the P-type or N-type semiconductor material forming spaced collector regions at junctions 108 with a conductive material 110 of the same type conductivity for flux of electrical current. Thus, for example, when semiconductor members 102 are P-type, then composites 104 are of N-type material. Buss bars 112 which can take the form of thick copper strips for serial electrical connection between the semiconductor members 102 and composites 104. Terminals 114 and 116 apply the electric potential of direct current to produce the concurrent flux of electric current and heat in the hybrid composite thermoelectric semiconductor structure 100. As in the embodiment of FIG. 2, the flux of heat is in the direction of the arrow 36 located in a refrigeration site, for example, through a high thermal conductivity ceramic plate 38 and then as a heat flux through the semiconductor members 102 and composites 104 including the PN junctions thereof to heat sink formed by the high thermal conductivity ceramic plate 40 where the heat is released in the cooling channel in the direction indicated by arrows 42.

Figure 4:
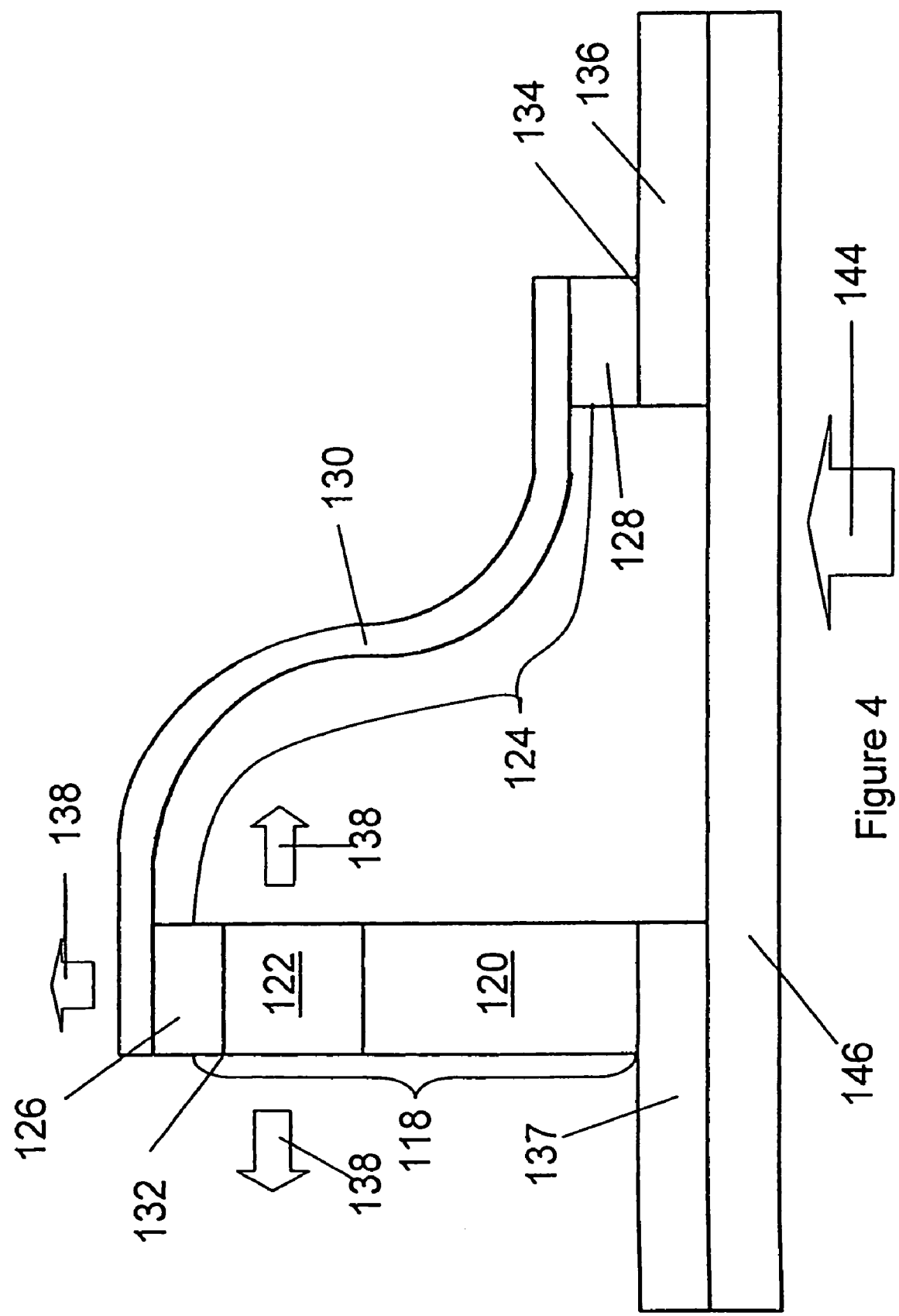
FIG. 4 illustrates in detail a further embodiment of the hybrid composite thermoelectric semiconductor structure.

FIG. 4 illustrates a hybrid composite thermoelectric semiconductor structure which for the purpose of only illustrating this embodiment of the invention includes a N-type composite 118 comprised of a N-type semiconductor 120 joined by a N-type conductive material 122 of, for example, copper for the concurrent flux of heat and electrical current. The conductive material 122 forms a junction with a P-type semiconductor composite 124. The composite 124 is comprised of two dices 126 and 128 of P-type semiconductor material joined by a P-type composite 130 to induce a flux of electrical current concurrent with a flux of heat. It is within the scope of the present invention to alter the selections of semiconductor materials by constructing the semiconductor 120 of P-type semiconductor material and composite 124 comprised of two dices 126 and 128 of N-type semiconductor material joined by a N-type composite 130. In the illustrated embodiment, the dice 126 forms a hot junction 132 with the N-type conductive material 122 and the dice 128 form a cold junction 134 with a buss bar 136. Another buss bar 137 is joined with the semiconductor 120 and together with buss bar 136 are electrically connected to a suitable source of direct current for inducing the heat flux flow. This arrangement of the P-type semiconductor composite 124 enables the use of the P-type composite 130 having low electrical resistance for good electrical efficiency and low heat flow properties for a high thermal heat transfer capacity. The conductor 122 can be equipped with heat transfer fins for improving the flow of heat into the cooling channel. Moreover, the P-type composite 130 can be embodied in a variety of different shapes with elongated dimensions to suit the operating environment. It is desired and intended that the flux of heat is dissipated at the hot junction 132 and along a length of the P-type conductor residing in a cooling channel indicated by arrow 138 bounded by spaced apart plates 140 and 142 for heat transfer to an air flow along cooling channel. Heat is moved from the refrigeration area in the direction indicated by arrow 144 through the high thermal conductivity ceramic plate 146, and then carried to the hot junctions 132 at the ceramic plate 140 and released in the cooling channel 138. The ceramic plates 140 and 146 are, for example, comprised of aluminum oxide, i.e. $Al_2O_3$. However, the plate 142 forming part of the cooling channel can be made from an electrical insulating material, such as for example mica, for electrical isolation since thermal conductivity is not particularly important at this site in the thermal electric structure.

Figure 5:
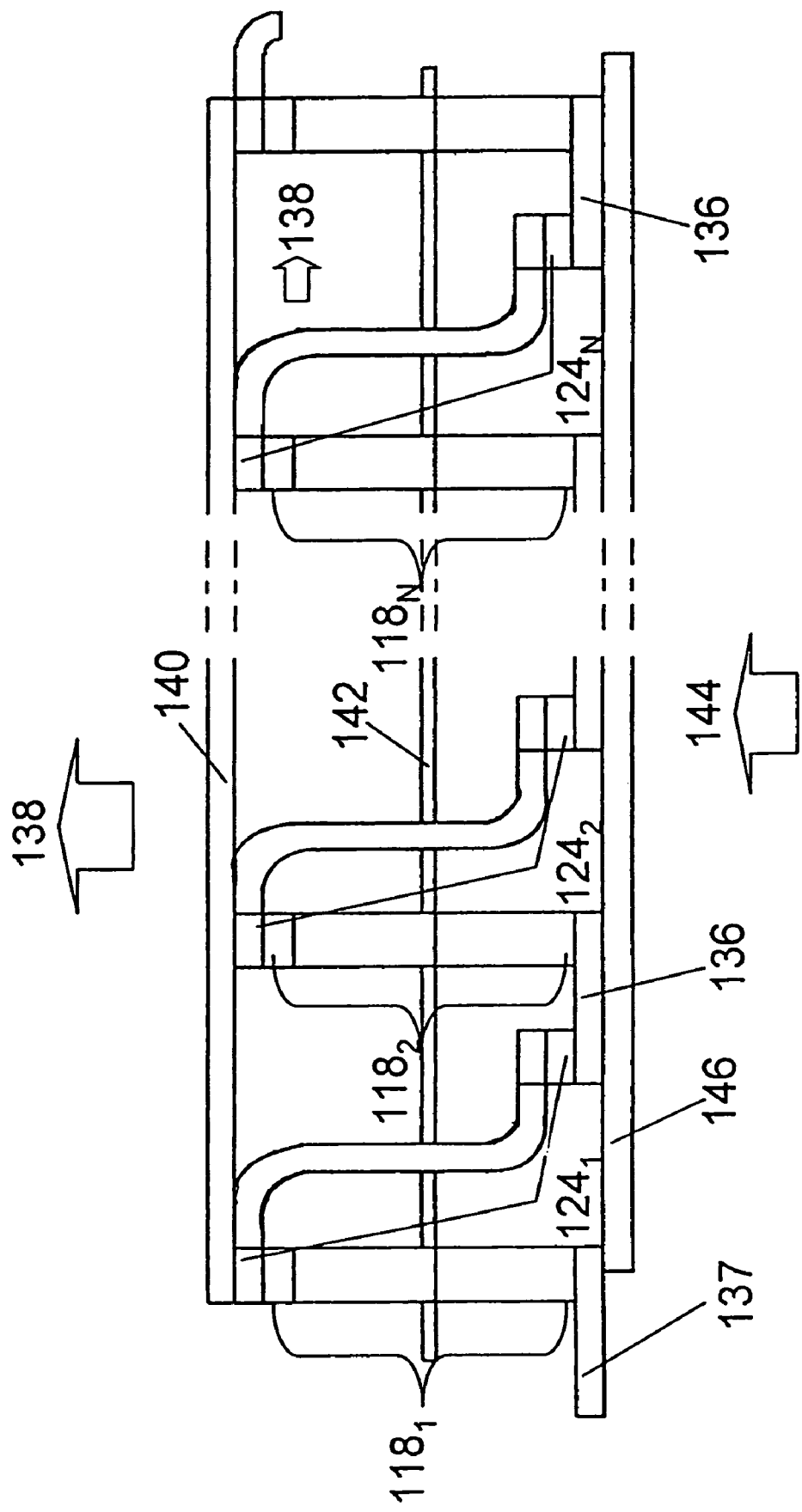
FIG. 5 plurality of the hybrid composite thermoelectric semiconductor structure illustrated in FIG. 4 and electrically connected in a serial.

The embodiment illustrated in FIG. 4 is more fully shown in FIG. 5 wherein there is a plurality of N-type composites $118_1$, $118_2$, - - - $118_{N\,and}$ a plurality of P-type semiconductor composites $124_1$, $124_2$, - - - $124_N$ electrically connected in a serial configuration by the buss bars 136 and 137. The very small electrical resistance of each composite are additive according to the series connections and therefore provide the desirable feature of allowing the use of an increased voltage and amperes levels for reduce heat generation by the semiconductors and increase heat flux from the hot source to the cold source or from the cold source to the hot source as determined by the polarity of the applied electric current. The row formation of multiple hybrid composite thermoelectric semiconductor structures shown in FIG. 5 can be repeated to provide an M×N array between ceramic plates.

Figure 6:
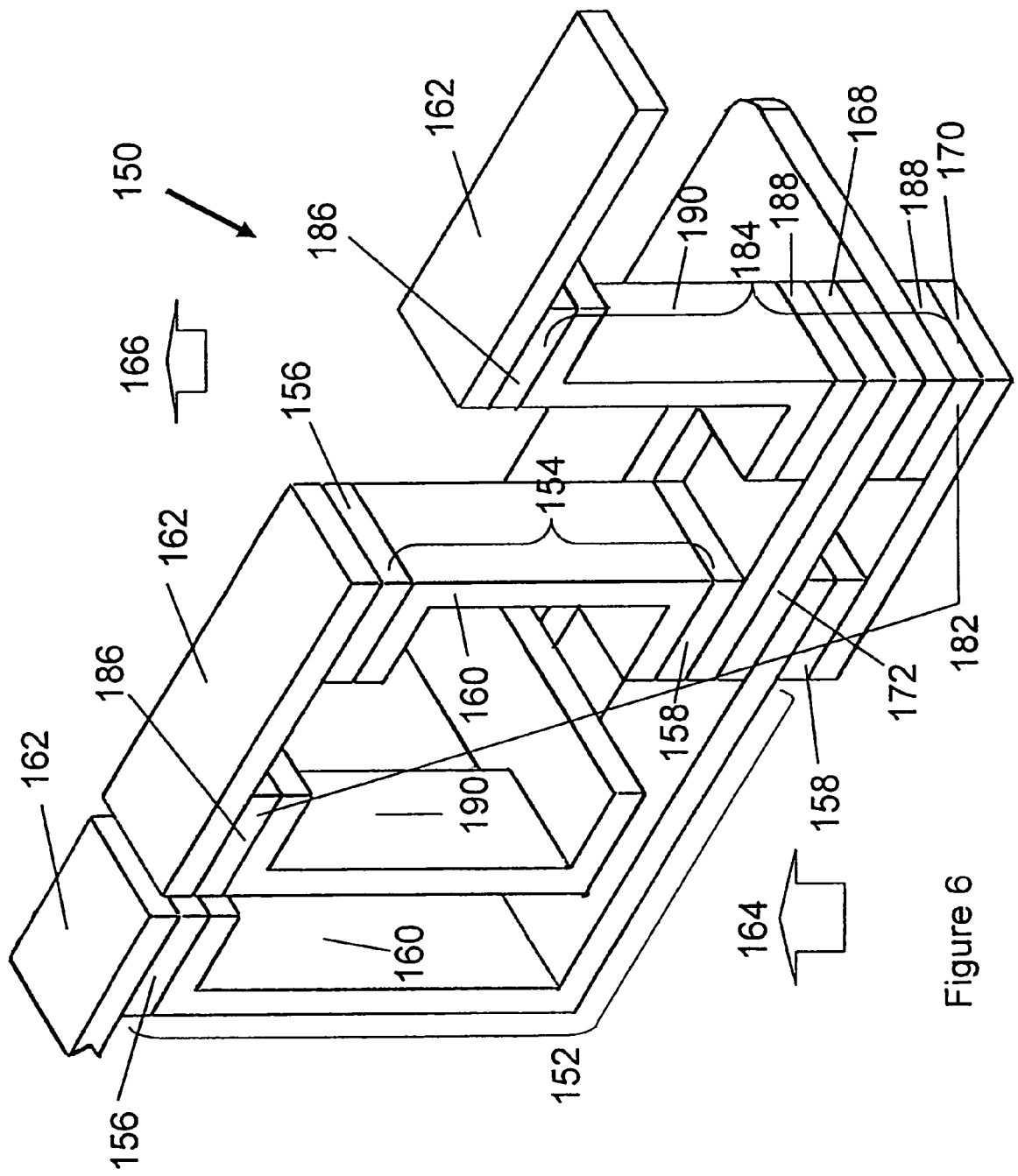
FIG. 6 illustrates a multistage composite thermoelectric module according to a further embodiment of the present invention.

FIG. 6 illustrates a multistage composite thermoelectric module 150 to not only increase the temperature differential between the refrigeration temperature and heat sink temperature but also increase the thermal capacity for removing heat in the direction of arrow 164 from the refrigeration area. Two stage P-type composites 152 and 154 are each comprised of two dices 156 and 158 of P-type semiconductor material joined by a P-type conductive material 160 to induce a flux of electrical current concurrent with a flux of heat. The dices 156 of each stage are joined to a buss bar 162 for heat transfer to an air flow along cooling channel indicated by arrow 166. The dices 158 of each stage are joined to separate buss bars 168 and 170. A ceramic layer 172 comprised of, for example, aluminum oxide, i.e. $Al_2O_3$ separates buss bar 168 from an underlying P-type conductive material 160. Two stage N-type composites 182 and 184 are each comprised of two dices 186 and 188 of N-type semiconductor material joined by an N-type conductive material 190 to induce a flux of electrical current concurrent with a flux of heat. The dices 186 of each stage are joined to a buss bar 162 for heat transfer to a flow of a heat transfer medium along cooling channel 166. Examples of a suitable heat transfer medium by convection are air and water. The necessary disposal of heat is by heat transfer using techniques of convection, conduction, boiling including heat pipe, or radiation and including combinations of these techniques. The dices 188 of each stage are joined to the separate buss bars 168 and 170 and the ceramic layer 172 also separates buss bar 168 from an underlying N-type conductive material 190. The buss bars 162, 168, 170 and 192 form the serial arrangement for electrical flux by the hybrid composite thermoelectric semiconductor structure and the multistage arrangement of the P-type composites 152 and 154 and the N-type composites 182 and 184 form the highly efficient thermal flux. This arrangement of multistage cooling modules provides that the two dices 156 of P-type semiconductor material are superimposed and have a common heat flux origin whereas the remaining two dices 158 of P-type semiconductor material are spaced apart and operate at independently spaced heat flux site along the bus bar 162. Similarly, two dices 186 of N-type semiconductor material are superimposed and have a common heat flux origin whereas the remaining two dices 188 of N-type semiconductor material are spaced apart and operate at independently spaced heat flux site along the bus bar 162. This construction and arrangement of parts provides the increase to the temperature differential between the refrigeration temperature and heat sink temperature and the increase to the thermal capacity for removing heat from the refrigeration area.

The net heat being carried from the cold junction (heat resource) to the hot junction (heat sink) is equal to the total power of the heat carrying capacity for defined P-type and N-type semiconductor materials reduced by the heat transfer from the hot junction to the cold junction and also reduced by the heat dissipation due to the electric resistance of the P-type and N-type semiconductor materials. Accordingly, it follows that by reducing the magnitude of the last two items, the heat transfer and heat dissipation, will produce an increase to the total heat pumped from a cold junction to a hot junction without changing the P-type and N-type materials and thereby the refrigeration efficiency can be increased by reducing energy dissipation and heat transfer between a cold junction and a hot junction. The lowering of the electrical resistively reduces the electrical energy dissipation and produces the result of an increase to the net heat carried from the cold junction to the hot junction. The refrigeration efficiency noticeably increases.

In current commercial market, $Bi_2Te_3$—$Sb_2Te_3$ based material as P-type semiconductor and $Bi_2Te_3$—$Bi_2Se_3$ based material as N-type semiconductor are most commonly used thermoelectric materials. The electrical resistively of $Bi_2Te_3$—$Sb_2Te_3$ based material as P-type semiconductor and $Bi_2Te_3$—$Bi_2Se_3$ based material as N type semiconductor both are around $10^{-5}$ Ωm. The electric resistance rate of copper is 1.7 $10^{-8}$ Ωm. The resistivity of current commercial semiconductor materials is one thousand times higher than that of copper. Thus copper as the N-type conductor replacing N-type semiconductor will significantly reduce the total resistivity of the N element and give a great increase to the refrigeration efficiency. The conductors having the form of shaped structures such as a heavy duty cable comprised of a solid mass or wire like strands, filaments or the like allows one or both of conductors of N-type conductivity and P-type conductivity mechanically flexible for selecting the desired heat discharge site for flux of heat, an important feature of the present invention. As explained in regard to the embodiment of FIG. 2, it is sufficient according to the present invention that since the buss bars are part of the flux path of heat that the buss bars act alone to release heat to the cooling channel, therefore the ceramic plate is an optional addition but desired.

The composite thermoelectric structures of the present invention produce three quantitative advantages. First, the composite structure greatly increases the value of the coefficient of performance by increasing the heat transfer from the cold junction to the hot junction. The reduced size of the semiconductor deices reduce the energy dissipation and heat transfer between the cold junction and the hot junction. The electric resistance of P or N element will produce two effects. If the capacity of Peltier effect is fixed, decreasing the electric dissipation (due to electrical resistance) will effectively increase the total heat removal from the cold junction to the hot junction. As another effect, the total work being done decreases during carrying heat. Both of these effects contribute to increase the value of the coefficient of operation. As the second advantage, this design increases the capacity of carrying heat. This technology not only increase the total capacity of carrying heat by decreasing the electric dissipation but also increase the total capacity by increasing electric current density.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

The invention claimed is:

1. A thermal electric structure including a plurality of thermal electric junctions connected in series by electrically conductive busses, and terminals to apply an electrically current across the serially connected hybrid thermal electric junctions, each of said thermal electric junctions comprising:
    an elongated semiconductor of either N or P-type joined in an end-to-end relation between an elongated conductive material of the same type conductivity as said elongated semiconductor and one of said electrically conductive busses;
    a first semiconductor dice of a type different from said type of said elongated semiconductor in contact with said elongated conductive material opposite said elongated semiconductor for establishing a hybrid P-N junction for both high thermal flux and high electrical flux; and
    an elongated conduit of the same type conductivity as said first semiconductor dice connected for a high electrical flux return path and a low heat flux return path from said first semiconductor dice to a second semiconductor dice of the same conductivity as said first semiconductor dice, said second semiconductor dice joined to another of said electrically conductive busses.

2. The thermoelectric structure according to claim 1 wherein the combination further includes a plurality of said P-type composite and a plurality of said N-type composite, and wherein said electrically conductive busses interconnect said plurality of said P-type composite and a plurality of said N-type composite forming a series circuit electrical circuit.

3. The thermoelectric structure according to claim 2 wherein at least one of said conductor of N-type conductivity and said conductor of P-type conductivity is sufficiently flexible for selectively establishing a desired heat discharge site for said flux of heat.

4. The thermoelectric structure according to claim 3 wherein said desired heat discharge site for said flux of heat accomplishes the heat transfer by convection, conduction, boiling including heat pipe, or radiation and combinations thereof.

5. The thermoelectric structure according to claim 3 wherein said either N or P-type conductive material comprise shaped structures having mechanically sufficiently flexible for selectively establishing a desired heat discharge site for flux of heat to allow the orientation of the heat discharge site to be remotely spaced and when desired angularly orientated as desired in relation to the heat source.

6. The thermoelectric structure according to claim 1 further including a ceramic member for inducing a flux of heat concurrent with electrically insulating said electrically conductive busses.

* * * * *